United States Patent

Ushida et al.

[11] Patent Number: 5,079,197
[45] Date of Patent: Jan. 7, 1992

[54] FERROELECTRIC CERAMICS

[75] Inventors: Yoshihisa Ushida; Hiroshi Mase, both of Chiba, Japan

[73] Assignee: Mitsui Petrochemical Industries, Ltd., Tokyo, Japan

[21] Appl. No.: 599,865

[22] Filed: Oct. 19, 1990

[30] Foreign Application Priority Data

Oct. 20, 1989 [JP] Japan .................. 1-273482

[51] Int. Cl.⁵ ................................ C04B 35/49
[52] U.S. Cl. ...................... 501/136; 252/62.9
[58] Field of Search ............ 501/134, 136, 138; 252/62.9

[56] References Cited

U.S. PATENT DOCUMENTS 4,749,668 6/1988 Fujino .................. 501/134
4,765,919 8/1988 Tomita et al. .......... 501/134

FOREIGN PATENT DOCUMENTS 54-159697 12/1979 Japan .

OTHER PUBLICATIONS

Database WPIL No. 86-058693.

*Primary Examiner*—William R. Dixon, Jr.
*Assistant Examiner*—Chris Gallo
*Attorney, Agent, or Firm*—Birch, Stewart, Kolasch & Birch

[57] ABSTRACT

The present invention relates to Perovskite ferroelectric ceramics comprising a Perovskite solid solution represented by the formula $$Pb_{1-(3/2)a}M_a\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$$

wherein M is at least one element selected from the group consisting of La and Nd, $x+y+z$ is 1, said Perovskite solution containing $MnO_2$.

When compared with known ferroelectric ceramics, the ferroelectric ceramics according to the invention has a larger piezoelectric constant d and also a sufficiently high Curie temperature Tc, while having a mechanical quality factor Qm practically equal to that of the known ferroelectric ceramics. Accordingly, the ferroelectric ceramics according to the invention exhibit excellent characteristics when used in application such as a driving part of an actuator, for example, of an ultrasonic motor where mechanical resonance of the material used is utilized.

6 Claims, No Drawings

FERROELECTRIC CERAMICS

FIELD OF THE INVENTION

This invention relates to ferroelectric ceramics of $Pb(Ni_{\frac{1}{3}}Nb_{\frac{2}{3}})O_3$-$Pb(Zn_{\frac{1}{3}}Nb_{\frac{2}{3}})O_3$-$PbTiO_3$-$PbZrO_3$ series. More particularly, the invention relates to ferroelectric ceramics of $Pb(Ni_{\frac{1}{3}}Nb_{\frac{2}{3}})O_3$-$Pb(Zn_{\frac{1}{3}}Nb_{\frac{2}{3}})O_3$-$PbTiO_3$-$PbZrO_3$ series high in both piezoelectric constant d and mechanical quality factor Qm and also high in Curie temperature Tc.

BACKGROUND OF THE INVENTION

Piezoelectric materials comprising ferroelectric ceramics have heretofore been used in various applications such as piezoelectric filters, piezoelectric transducers, ultrasonic oscillators or piezoelectric buzzers. Typical ferroelectric ceramics used in such applications are solid solutions of $PbTiO_3$-$PbZrO_3$ series. Further, solid solutions of $PbTiO_3$-$PbZrO_3$ series combined with a solid solution of a complex Perovskite type compound such as $Pb(Mg_{\frac{1}{3}}Nb_{\frac{2}{3}})O_3$, $Pb(Ni_{\frac{1}{3}}Nb_{\frac{2}{3}})O_3$ or $Pb(Zn_{\frac{1}{3}}Nb_{\frac{2}{3}})O_3$ are also known as ferroelectric ceramics having improved piezoelectric properties.

On the other hand, the use of piezoelectric ceramic materials as an actuator has recently been studied. In this case, it is necessary to transform electric energy to mechanical energy by the piezoelectric ceramic material. In order to transform the energy piezoelectric ceramic materials having a large piezoelectric constant d are desired.

Generally, the piezoelectric constant d of a piezoelectric ceramic material is related to an electromechanical coupling factor k and a relative dielectric constant $\epsilon$ of the piezoelectric ceramic material by the equation $$d \propto k\sqrt{\epsilon}$$

Therefore, in order to increase the piezoelectric constant d, the electromechanical coupling factor k and/or the relative dielectric constant $\epsilon$ must be increased.

Further, in applications of piezoelectric ceramic materials as a driving part of an actuator, for such as in an ultrasonic motor, where mechanical resonance of the material is utilized, it is desired that both the piezoelectric constant d and the mechanical quality factor Qm are large. That is, if a piezoelectric ceramic material is used in an ultrasonic motor, i.e. in the resonant frequency region, and the mechanical quality factor Qm of the material is small, then the amplitude of the mechanical resonance of the material will not become large and the heat generated by the high frequency driving involved will become large. This leads to an undesirable reduction in the spontaneous polarization of the material and to an undesirable decrease in piezoelectric constant d of the material.

Similarly, it is desired that when piezoelectric ceramic materials are used as an actuator, they posses a high Curie temperature, Tc, so that the in spontaneous polarization and the piezoelectric constant d of the material are not undesirably reduced by the high heat generated by the high frequency driving of the material further a high TC allows for a broader temperature range at which the material is operable as the actuator.

While the mechanical quality factor Qm of solid solutions of $PbTiO_3$-$PbZrO_3$ series or of $PbTiO_3$-$PbZrO_3$ series combined with a solid solution of a complex Perovskite, such as $Pb(Mg_{\frac{1}{3}}Nb_{\frac{2}{3}})O_3$, $Pb(Ni_{\frac{1}{3}}Nb_{\frac{2}{3}})O_3$ or $Pb(Zn_{\frac{1}{3}}Nb_{\frac{2}{3}})O_3$ can be improved by incorporating a hard compound, such as $MnO_2$ therein. But, there is been a problem with such modification in that the piezoelectric constant d of the material is drastically decreased as the amount of $MnO_2$ incorporated increases.

While the piezoelectric constant d of the above-mentioned solid solutions can be improved, on the one hand, by the incorporation of a soft compound such as $Nb_2O_5$, $Ta_2O_5$, $La_2O_3$, $Nd_2O_3$ or $Bi_2O_3$ therein; or by substituting parts of Pb of the above-mentioned solid solutions with Ba, Sr or Ca, there is a problem with such a modification in that the Curie temperature of the material is drastically decreased as the amount of the soft compound or of the substitution amount increases.

In light of the problems as mentioned above, the inventors conducted thorough investigations in metal ion substituents that may be used in Perovskite solid solutions of $PbTiO_3$-$PbZrO_3$ series, and as the result it has been found that modifying solid solutions of $Pb(Ni_{\frac{1}{3}}Nb_{\frac{2}{3}})O_3$-$Pb(Zn_{\frac{1}{3}}Nb_{\frac{2}{3}})O_3$-$PbTiO_3$-$PbZrO_3$ series by substituting parts of Pb of the solid solutions with La or Nd in a specific amount and incorporating a specific amount of $MnO_2$ produces a ferroelectric ceramic that exhibits a more stable piezoelectric constant d, an improved mechanical quality factor Qm and, a high Curie temperature Tc. The present invention has been accomplished on the basis of the above findings.

OBJECT OF THE INVENTION

The present invention is based on the above-mentioned findings, and accordingly an object of the invention is to provide ferroelectric ceramics a large piezoelectric constant d and mechanical quality factor Qm and also a high Curie temperature and thereby obtain a ceramic has excellent piezoelectric properties.

SUMMARY OF THE INVENTION

The ferroelectric ceramics according to the present invention is a Perovskite solid solution comprising a solid solution represented by the formula

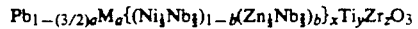

$$Pb_{1-(3/2)a}M_a\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$$

wherein M is at least one element selected from the group consisting of La and Nd, $x+y+z$ is 1, a is from 0.005 to 0.03, b is from 0.5 to 0.95, x is from 0.1 to 0.4, y is from 0.3 to 0.5 and z is from 0.2 to 0.5, with the provision that $MnO_2$ is contained in an amount of from 0.3 to 1.0% by weight based on the Perovskite solid solution.

The ferroelectric ceramics according to the invention comprising Perovskite crystals having the composition as mentioned above into which a specific amount of $MnO_2$ has been incorporated, have a larger piezoelectric constant d and also a sufficiently high Curie temperature compared with conventional ferroelectric ceramics, in spite of the fact that the present ferroelectric ceramics have a mechanical quality factor Qm practically equal to that of the conventional ferroelectric ceramics. Accordingly, the ferroelectric ceramics according to the invention exhibit excellent characteristics when used in applications as a driving part of an actuator, such as an ultrasonic motor wherein mechanical resonance of the material is utilized.

DETAILED DESCRIPTION OF THE INVENTION

The ferroelectric ceramics according to the present invention will now be described below in detail.

The ferroelectric ceramics according to the invention is a Perovskite solid solution comprising a solid solution represented by the formula $$Pb_{1-(3/2)a}M_a\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$$

wherein
M is at least one element selected from the group consisting of La and Nd,
$x+y+z$ is 1,
a is from 0.005 to 0.03, preferably from 0.007 to 0.02
b is from 0.5 to 0.95, preferably from 0.6 to 0.9
x is from 0.1 to 0.4, preferably from 0.2 to 0.4
y is from 0.3 to 0.5, preferably from 0.33 to 0.4, and
z is from 0.2 to 0.5, preferably from 0.27 to 0.4, and containing $MnO_2$ in an amount of from 0.3 to 1.0% by weight, preferably from 0.4 to 0.8 % by weight based on the Perovskite solid solution.

When the Perovskite crystals constituting the ferroelectric ceramics according to the invention are represented by $ABO_3$, Pb and, La and/or Nd substituting the parts of Pb are present in the form of metal ions in the A sites of the crystals. In that case, a value "a" representing the amount of La and/or Nd substituting the parts of Pb is desirably not less than 0.005 in order to obtain a large piezoelectric constant d of the crystals, and is desirably not more than 0.03 in order to maintain the Curie temperature Tc of the crystals at a high level.

Further, the amount of $MnO_2$ to be incorporated into the above-mentioned Perovskite crystals is desirably not less than 0.3% by weight based on the crystals in order to obtain a large mechanical quality factor Qm of the crystals, and is desirably not more than 1.0% by weight in order to maintain the piezoelectric constant d of the crystals at a high level.

When parts of Pb of the Perovskite crystals having a specific composition range represented by the formula $Pb\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$ constituting the ferroelectric ceramics according to the invention is substituted with the specific amount of La and/or Nd and incorporated with the specific amount of $MnO_2$ in the manner now described, the mechanical quality factor Qm of the cyrstal can be improved and the Curie temperature Tc of the crystals can be maintained at a high level without decrease in the piezoelectric constant d of the crystals and, as a consequence, ferroelectric ceramics having a large piezoelectric constant d and mechanical quality factor Qm as well as a high Curie temperature Tc can effectively be obtained.

The ferroelectric ceramics having the above-mentioned composition as defined in the invention may be prepared by admixing of particulate metal compounds such as oxides and salts in such proportions which provide a desired composition when sintered, and sintering the admixture. Processes for preparing the starting particulate metal compounds are not particularly limited. They may be prepared by various known processes including liquid phase processes such as precipitation, coprecipitation, alkoxide, and sol-gel processes, and solid phase processes such as those based on decomposition of oxalates and blending oxides. The thus obtained admixture of particulate metal compounds in appropriate proportions may be calcined at a temperature of from 800° C. to 1000° C., pulverized in a ball mill, dried, pressed to a sheet or disc under a pressure of from 500 to 1500 kg/cm², and finally sintered at a temperature of from 1000° to 1300° C., whereupon a desired ferroelectric ceramics may be obtained.

EXAMPLES

While the present invention will now be described below with reference to the following examples, it should be appreciated that the invention is in no way restricted to the examples.

The radial electromechanical coupling factor (Kp), relative dielectric constant ($\epsilon_{33}^T/\epsilon_0$), piezoelectric constant ($d_{31}$), and mechanical quality factor (Qm) of the ferroelectric ceramics were measured in accordance with Japan Electronic Material Manufactures Association Standard (EMAS).

EXAMPLES 1-2, COMPARATIVE EXAMPLES 1-4

PbO, $ZrO_2$, $TiO_2$, NiO, ZnO, $Nb_2O_5$, $La_2O_3$ and $MnO_2$ were weighed in proportions which provide each composition as indicated in Table 1, pulverized and admixed in a ball mill. The pulverized admixture was calcined at a temperature of 800° to 1000° C. for a period of from 1 to 2 hours, pulverized in a ball mill and dried. The mixture was then pressed to a disc having a diameter of 25 mm under a pressure of 1000 kg/cm² and finally sintered at a temperature of from 1050° to 1250° C. for period of from 1 to 2 hours. The sintered disc thus prepared was polished to a thickness of 0.5 mm, electroded with silver paste on both surfaces and baked. It was then poled by application of a DC electric field of from 20 to 40 KV/cm in a silicone oil and thereafter aged for 12 hours. The specimen so prepared was tested for various electric properties.

The results are shown in Table 1.

In Table 1, a, b, x, y and z represent coefficients appearing in the formula:

$$Pb_{1-(3/2)a}M_a\{(Ni_{1/3}Nb_{2/3})_{1-b}(Zn_{1/3}Nb_{2/3})_b\}_x Ti_y Zr_z O_3$$

$$x + y + z = 1$$

From comparison of Example 1 and of Comparative Example 1, it is understood that the ferroelectric ceramic having substituted parts of Pb with La and contained $MnO_2$ (Example 1) have a higher radial electromechanical coupling factor Kp and piezoelectric constant $d_{31}$ compared with the ferroelectric ceramic having contained $MnO_2$ but without substituting Pb with La (Comparative Example 1), while having a mechanical quality factor Qm practically equal to that of Comparative Example 1.

From comparison of Example 1 and of Comparative Example 2, it is understood that the ferroelectric ceramics of Example 1 have a higher radial electromechanical coupling factor Kp and also a slightly lower piezoelectric constant $d_{31}$ compared with the ferroelectric ceramics having substituted parts of Pb with La but without containing $MnO_2$ (Comparative Example 2), in addition to such results as may sufficiently be predicted from the conventional information that the ferroelectric ceramics obtained in Example 1 is low in relative dielectric constant $\epsilon_x^T/\epsilon_0$ and high in mechanical quality factor Qm.

It is also understood that there is observed a tendency similar to the above-mentioned when compared Example 2 with Comparative Examples 3 and 4, respectively.

EXAMPLES 3–7, and COMPARATIVE EXAMPLES 5–7

Specimens of ferroelectric ceramics were prepared by the same procedure as described in Example 1 except that the values of coefficients a and b appearing in the formula

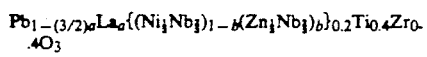

$$Pb_{1-(3/2)a}La_a\{(Ni_{\frac{1}{3}}Nb_{\frac{2}{3}})_{1-b}(Zn_{\frac{1}{3}}Nb_{\frac{2}{3}})_b\}_{0.2}Ti_{0.4}Zr_{0.4}O_3$$

were changed as indicated in Table 2. The specimens so prepared were tested for various electric properties.

The results are shown in Table 2.

From comparison between Examples 4–5 and Comparative Example 1 and from comparison between Examples 6–7 and Comparative Example 5, it is understood that the effect obtainable by substitution of Pb with La is very great. From the results obtained in Comparative Examples 6 and 7, however, it is appreciated that when the value of coefficient b becomes not more than 0.5, the effect on substitution of Pb with La is not so great.

EXAMPLES 8–9, and COMPARATIVE EXAMPLES 8–9

Specimens of ferroelectric ceramics were prepared by the same procedures as described in Examples 1 and 7 and Comparative Example 1 except that parts of Pb were substituted with Nd in place of La. The specimens so prepared were tested for various electric properties.

The results are shown in Table 3.

From comparison between Example 8 and Comparative Example 8 and from comparison between Example 9 and Comparative Example 9, it is understood that the specimens obtained by containing $MnO_2$ therein (Examples 8 and 9) are high in mechanical quality factor Qm and, in addition thereto, are higher in radial electromechanical coupling factor Kp compared with the specimens obtained by substituting parts of Pb with Nd but without containing $MnO_2$ therein (Comparative Examples 8 and 9), and also have values of piezoelectric constant $d_{31}$ practically equal to those of the specimens of Comparative Examples 8 and 9.

TABLE 1

| | Composition | | | | | | Electric properties | | | | |
|---|---|---|---|---|---|---|---|---|---|---|---|
| | M | a | b | x | y | z | $MnO_2$ (Wt %) | $\epsilon_{33}^T/\epsilon_0$ | kp (%) | $d_{31}$ (× $10^{-12}$ m/V) | Qm | Tc (°C.) |
| Ex. 1 | La | 0.013 | 0.8 | 0.2 | 0.4 | 0.4 | 0.5 | 1700 | 60.7 | 156 | 1440 | 276 |
| Comp. Ex. 1 | — | 0 | 0.8 | 0.2 | 0.4 | 0.4 | 0.5 | 1010 | 55.2 | 109 | 1450 | 300 |
| Comp. Ex. 2 | La | 0.013 | 0.8 | 0.2 | 0.4 | 0.4 | 0 | 2180 | 54.7 | 164 | 92 | 277 |
| Ex. 2 | La | 0.013 | 0.8 | 0.4 | 0.33 | 0.27 | 0.5 | 3440 | 61.3 | 224 | 1500 | 219 |
| Comp. Ex. 3 | — | 0 | 0.8 | 0.4 | 0.33 | 0.27 | 0.5 | 2780 | 56.5 | 186 | 1390 | 238 |
| Comp. Ex. 4 | La | 0.013 | 0.8 | 0.4 | 0.33 | 0.27 | 0 | 3950 | 57.8 | 233 | 84 | 221 |

TABLE 2

| | Composition | | | | | | Electric properties | | | | |
|---|---|---|---|---|---|---|---|---|---|---|---|
| | M | a | b | x | y | z | $MnO_2$ (Wt %) | $\epsilon_{33}^T/\epsilon_0$ | kp (%) | $d_{31}$ (× $10^{-12}$ m/V) | Qm | Tc (°C.) |
| Ex. 3 | La | 0.01 | 0.9 | 0.2 | 0.4 | 0.4 | 0.5 | 1670 | 61.3 | 156 | 1510 | 284 |
| Ex. 4 | La | 0.01 | 0.8 | 0.2 | 0.4 | 0.4 | 0.5 | 1520 | 61.0 | 148 | 1630 | 280 |
| Ex. 5 | La | 0.007 | 0.8 | 0.2 | 0.4 | 0.4 | 0.5 | 1430 | 60.5 | 143 | 1790 | 286 |
| Ex. 6 | La | 0.02 | 0.6 | 0.2 | 0.4 | 0.4 | 0.5 | 1650 | 58.7 | 149 | 1600 | 261 |
| Ex. 7 | La | 0.013 | 0.6 | 0.2 | 0.4 | 0.4 | 0.5 | 1230 | 56.8 | 124 | 1640 | 268 |
| Comp. Ex. 5 | — | 0 | 0.6 | 0.2 | 0.4 | 0.4 | 0.5 | 910 | 52.0 | 98 | 1710 | 290 |
| Comp. Ex. 6 | La | 0.013 | 0.4 | 0.2 | 0.4 | 0.4 | 0.5 | 1040 | 53.2 | 106 | 1740 | 262 |
| Comp. Ex. 7 | — | 0 | 0.4 | 0.2 | 0.4 | 0.4 | 0.5 | 870 | 51.3 | 94 | 1800 | 283 |

TABLE 3

| | Composition | | | | | | Electric properties | | | | |
|---|---|---|---|---|---|---|---|---|---|---|---|
| | M | a | b | x | y | z | $MnO_2$ (Wt %) | $\epsilon_{33}^T/\epsilon_0$ | kp (%) | $d_{31}$ (× $10^{-12}$ m/V) | Qm | Tc (°C.) |
| Ex. 8 | Nd | 0.013 | 0.8 | 0.2 | 0.4 | 0.4 | 0.5 | 2020 | 60.0 | 168 | 1310 | 278 |
| Comp. Ex. 8 | Nd | 0.013 | 0.8 | 0.2 | 0.4 | 0.4 | 0 | 2140 | 54.5 | 162 | 94 | 280 |
| Ex. 9 | Nd | 0.013 | 0.6 | 0.2 | 0.4 | 0.4 | 0.5 | 1980 | 61.6 | 171 | 1260 | 270 |
| Comp. Ex. 9 | Nd | 0.013 | 0.6 | 0.2 | 0.4 | 0.4 | 0 | 2100 | 59.8 | 176 | 88 | 272 |

EFFECT OF THE INVENTION

As illustrated hereinbefore, the ferroelectric ceramics according to the present invention are Perovskite solid solutions comprising solid solutions having a specific composition represented by the following formula.

$Pb\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$ In the Perovskite solid solutions mentioned above, parts of Pb have been substituted with a specific amount of La or Nd, and also a specific amount of $MnO_2$ is contained. Therefore, when compared with known ferroelectric ceramics, the ferroelectric ceramic according to the invention have a larger piezoelectric constant d and maintain a high Curie temperature Tc, while having a mechanical quality factor Qm practically equal to that of the known ferroelectric ceramics. Accordingly, the ferroelectric ceramics according to the invention exhibit excellent characteristics when used in applications such as a driving part of an actuator, for example, of an ultrasonic motor, where mechanical resonance of the material used is utilized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric ceramic that is a Perovskite solid solution, which comprises a solid solution represented by the formula:

$$Pb_{1-(3/2)a}M_a\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$$

wherein M is at least one element selected from the group consisting of La and Nd, $x+y+z$ is 1, a is from 0.005 to 0.03, b is from 0.5 to 0.95, x is from 0.1 to 0.4, y is from 0.3 to 0.5 and z is from 0.2 to 0.5, and containing $MnO_2$ in an amount of from 0.3 to 1.0% by weight based on the Perovskite solid solution.

2. The ferroelectric ceramic as claimed in claim 1 wherein M in the formula is La.

3. The ferroelectric ceramic as claimed in claim 1 wherein M in the formula is Nd.

4. An actuator comprising a ferroelectric ceramic that is a Perovskite solid solution, wherein said ferroelectric ceramic comprises a solid solution represented by the formula:

$$Pb_{1-(3/2)a}M_a\{(Ni_{\frac{1}{3}}Nb_{\frac{2}{3}})_{1-b}(Zn_{\frac{1}{3}}Nb_{\frac{2}{3}})_b\}_x Ti_y Zr_z O_3$$

wherein M is at least one element selected from the group consisting of La and Nd, $x+y+z$ is 1, a is from 0.005 to 0.03, b is from 0.5 to 0.95, x is from 0.1 to 0.4, y is from 0.3 to 0.5 and z is from 0.2 to 0.5, and containing $MnO_2$ in an amount of from 0.3 to 1.0% by weight based on the Perovskite solid solution.

5. The actuator as claimed in claim 4 wherein M in the formula is La.

6. The actuator as claimed in claim 4 wherein M in the formula is Nd.

* * * * *